(12) United States Patent
Jow

(10) Patent No.: US 9,659,842 B2
(45) Date of Patent: May 23, 2017

(54) METHODS OF FABRICATING QFN SEMICONDUCTOR PACKAGE AND METAL PLATE

(71) Applicant: APTOS TECHNOLOGY INC., Hsinchu (TW)

(72) Inventor: En-min Jow, Taipei (TW)

(73) Assignee: APTOS TECHNOLOGY INC., Hsinchu (TW)

( * ) Notice: Subject to any disclaimer, the term of this patent is extended or adjusted under 35 U.S.C. 154(b) by 0 days.

(21) Appl. No.: 14/863,436

(22) Filed: Sep. 23, 2015

(65) Prior Publication Data

US 2016/0013122 A1 Jan. 14, 2016

Related U.S. Application Data

(63) Continuation of application No. 13/095,843, filed on Apr. 27, 2011, now Pat. No. 9,171,740.

(51) Int. Cl.
*H01L 21/00* (2006.01)
*H01L 23/495* (2006.01)
(Continued)

(52) U.S. Cl.
CPC .... *H01L 23/49548* (2013.01); *H01L 21/4825* (2013.01); *H01L 21/4832* (2013.01);
(Continued)

(58) Field of Classification Search
CPC ........... H01L 23/49503; H01L 23/4951; H01L 23/4824; H01L 2224/04042; H01L 2224/13026; H01L 2224/14104; H01L 2224/16012; H01L 2224/16013; H01L 2224/16104; H01L 2224/17104; H01L 2224/48177; H01L 2224/48179; H01L 2224/48247; H01L 2224/48248; H01L 2224/48249; H01L 21/4853; H01L 23/4952; H01L 23/52; H01L 21/56; H01L 23/28; H01L 23/49861; H01L 2924/00014; H01L 2924/14; H01L 2924/181; H01L 2924/00; H01L 2924/00012; H01L 2924/207; H01L 2924/01046; H01L 2924/01079; H01L 2924/18165; H01L 2224/45015; H01L 2224/45099; H01L 2224/73257; H01L 2224/73265; H01L 2224/85439; H01L 2224/85444; H01L 2224/85464; H01L 21/4825;
(Continued)

(56) References Cited

U.S. PATENT DOCUMENTS 5,953,589 A * 9/1999 Shim ................. H01L 21/565
257/E21.504
6,365,980 B1 * 4/2002 Carter, Jr. ............ H01L 21/565
257/678
(Continued)

*Primary Examiner* — Teresa M Arroyo
(74) *Attorney, Agent, or Firm* — Chieh-Mei Wang

(57) ABSTRACT

A method for fabricating a quad flat non-leaded (QFN) package includes: forming die pads and bump solder pads by pressing a metal plate, wherein each of the die pads and the bump solder pads has at least a cross-sectional area greater than another cross-sectional area located underneath along its vertical thickness dimension, thereby enabling the die pads and the solder pads to be securely embedded in an encapsulant.

16 Claims, 5 Drawing Sheets

(51) Int. Cl.
*H01L 21/48* (2006.01)
*H01L 21/56* (2006.01)
*H01L 23/31* (2006.01)
*H01L 23/00* (2006.01)

(52) U.S. Cl.
CPC ........ *H01L 21/4842* (2013.01); *H01L 21/565* (2013.01); *H01L 23/3114* (2013.01); *H01L 23/4952* (2013.01); *H01L 23/49503* (2013.01); *H01L 23/49513* (2013.01); *H01L 23/49541* (2013.01); *H01L 23/49582* (2013.01); *H01L 23/3107* (2013.01); *H01L 24/48* (2013.01); *H01L 2224/48247* (2013.01); *H01L 2224/73257* (2013.01); *H01L 2224/73265* (2013.01); *H01L 2224/85439* (2013.01); *H01L 2224/85444* (2013.01); *H01L 2224/85464* (2013.01); *H01L 2924/00014* (2013.01); *H01L 2924/01046* (2013.01); *H01L 2924/01079* (2013.01); *H01L 2924/14* (2013.01); *H01L 2924/181* (2013.01); *H01L 2924/18165* (2013.01)

(58) Field of Classification Search
CPC ............. H01L 21/4832; H01L 21/4842; H01L 21/565; H01L 23/3107; H01L 23/3114; H01L 23/49513; H01L 23/49541; H01L 23/49548; H01L 23/49582; H01L 24/48; C08J 2203/146; C08J 2203/162; C08J 2203/202; C09K 2205/126; C09K 2205/22; C09K 3/30; C09K 5/045; C11D 17/00
USPC .................. 257/676, 737, 778, 784; 438/112
See application file for complete search history.

(56) References Cited

U.S. PATENT DOCUMENTS

| | | | |
|---|---|---|---|
| 7,112,521 B1* | 9/2006 | Lin | H01L 21/4832 257/738 |
| 2010/0029046 A1* | 2/2010 | Camacho | H01L 21/568 438/118 |
| 2010/0072599 A1* | 3/2010 | Camacho | H01L 21/6835 257/686 |
| 2010/0072618 A1* | 3/2010 | Camacho | H01L 21/6835 257/738 |
| 2011/0140263 A1* | 6/2011 | Camacho | H01L 21/4832 257/692 |
| 2011/0298109 A1* | 12/2011 | Pagaila | H01L 21/56 257/660 |
| 2011/0316132 A1* | 12/2011 | Pagaila | H01L 23/4952 257/676 |

* cited by examiner

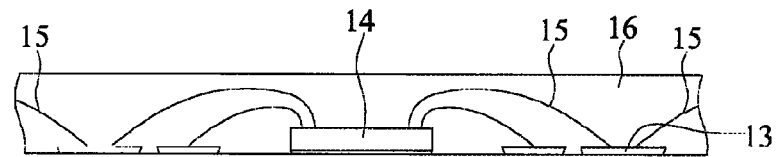
FIG.1D
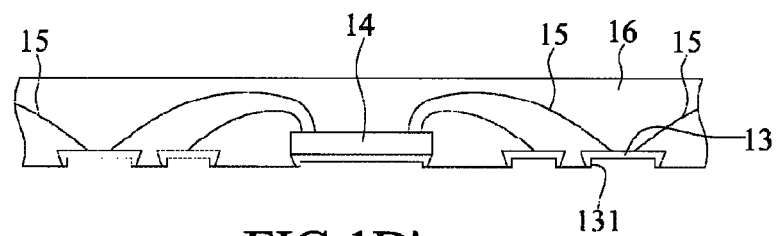
FIG.1D'
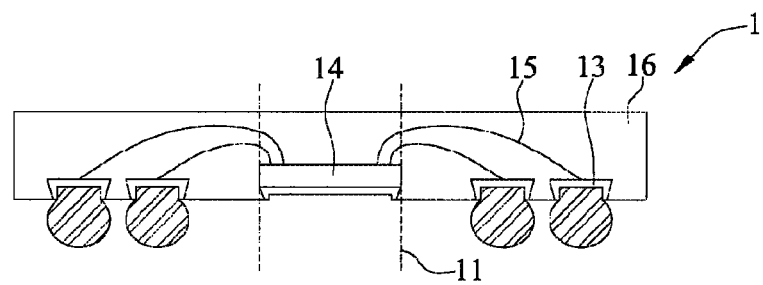
FIG.1E
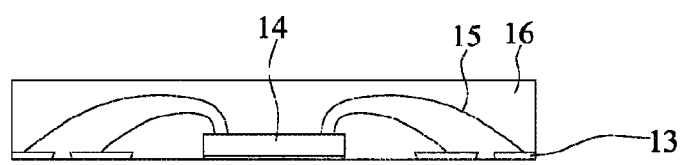
FIG.1E'
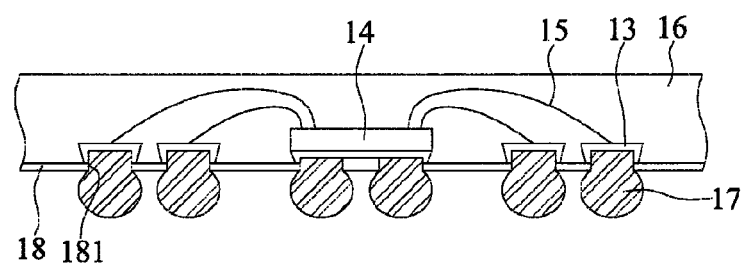
FIG.1E"

METHODS OF FABRICATING QFN SEMICONDUCTOR PACKAGE AND METAL PLATE

CROSS REFERENCE TO RELATED APPLICATIONS

This application is a continuation of U.S. Ser. No. 13/095,843 filed on Apr. 27, 2044, now U.S. Pat. No. 9,171,740, which is hereby incorporated by reference in its entirety.

BACKGROUND OF THE INVENTION

1. Field of the Invention

The present invention relates generally to a fabrication method of packaging structure, and more particularly, to a fabrication method of quad flat non-leaded (QFN) semiconductor package and a fabrication method thereof.

2. Description of Related Art

Conventionally, a lead frame is used as a chip carrier for carrying a chip so as to form a semiconductor package. The lead frame mainly comprises a die pad and a plurality of leads disposed around the periphery of the die pad. The chip is adhered to the die pad and electrically connected to the leads through a plurality of bonding wires. The chip, the die pad, the bonding wires and the inner sections of the leads are then encapsulated by a packaging resin so as to form a semiconductor package with a lead frame.

Currently, the development of packaging structures with high integration and high density has become the primary goal of the industry. Carriers used for chip scale packages generally comprise lead frames, flexible substrates, rigid substrates and so on. Therein, the lead frames are most widely used due to their low cost and ease of processing. For example, a QFN package is a lead frame based chip scale package, which is characterized in that the leads thereof do not extend out from the package sides, thus reducing the overall package size.

FIG. 4A is a cross-sectional view of a QFN package using a lead frame as a chip carrier as disclosed by U.S. Pat. Nos. 6,143,981, 6,130,115 and 6,198,171. Referring to FIG. 4A, a chip 42 is disposed on a lead frame 40 having leads 41 and is electrically connected to the leads 41 through a plurality of bonding wires 43, and an encapsulant 44 is formed to encasuplate the lead frame 40, the chip 42 and the bonding wires 43 while exposing the bottom surfaces of the leads 41. As such, by disposing a solder material (not shown) on the exposed surfaces of the leads 41, the packaging structure can be electrically connected to an external device such as a printed circuit board through the solder material.

However, the above-described lead frame type structure has quite limited I/O count and therefore cannot meet the requirement of high-level products. Further, the leads of the lead frame may fall off after a singulation process of the packaging structure. Furthermore, as shown in FIG. 4B, since the exposed surfaces of the leads 41 are flush with the encapsulant 44, when solder balls are mounted to the leads 41 for electrically connecting an external printed circuit board, a solder bridge can easily occur between adjacent solder balls so as to form a bridge or short circuit between the leads 41, thus resulting in poor electrical connection of the packaging structure.

In addition, a lead frame can be formed by etching a copper foil substrate so as to increase the number of leads, thereby increasing the I/O count. However, such an etching process is quite complicated and time-consuming. Further, when an encapsulant is filled in the above-described structures, the encapsulant may overflow to the exposed surfaces of the leads, thus adversely affecting the mounting of solder balls and the electrical connection of the solder balls and leads. Furthermore, the lead frame formed by etching a copper foil substrate generally has a separated and incomplete structure, which often causes loose soldering to occur in an ultrasonic soldering process.

Therefore, it is imperative to provide overcome the above drawbacks of the prior art.

SUMMARY OF THE INVENTION

In view of the above drawbacks of the prior art, the present invention provides a method for fabricating a QFN semiconductor package, which comprises the steps of: preparing a metal plate with a plurality of die mounting areas defined thereon; pressing the metal plate by a mold so as to form die pads in the die mounting areas of the metal plate, respectively, and a plurality of bump solder pads around the periphery of each of the die mounting areas, wherein each of the bump solder pads has at least a cross-sectional area greater than another cross-sectional area located underneath along its vertical thickness dimension, each of the die pads has at least a cross-sectional area greater than another cross-sectional area located underneath along its vertical thickness dimension, and the bottom surfaces of the bump solder pads are higher than the bottom surfaces of the die pads along its vertical thickness dimension; mounting chips on the die pads, respectively; electrically connecting the chips and the bump solder pads through bonding wires, respectively; forming an encapsulant to cover the metal plate, the chips and the bonding wires such that the bump solder pads are securely embedded in the encapsulant; removing the bottom of the metal plate such that the die pads and the bump solder pads are arranged at intervals from each other; and cutting the encapsulant so as to form a plurality of semiconductor packages.

In an embodiment, the mold comprises a male mold, a female mold and a plurality of insertion elements. The female mold has a plurality of array-arranged cavities and grooves communicating with the cavities of a same row, and the insertion elements are slidingly disposed in the grooves, respectively, such that the open area of the cavities is less than the bottom area of the cavities.

In another embodiment, the step of pressing the metal plate to form the die pads and the bump solder pads comprises: pressing the metal plate by the mold to form the die pads and the bump solder pads; and pressing the top surfaces of the die pads and the bump solder pads such that each of the bump solder pads has at least a cross-sectional area greater than another cross-sectional area located underneath along its vertical thickness dimension, and each of the die pads has at least a cross-sectional area greater than another cross-sectional area located underneath along its vertical thickness dimension.

The present invention further provides a method of fabricating the previous metal plate by the mold.

According to the present invention, the metal plate is removed after formation of the encapsulant, thereby preventing the encapsulant from overflowing onto the bottom surfaces of the bump solder pads as in the prior art. Further, the structure of the bump solder pads allows the bump solder pads to be securely embedded in the encapsulant so as not to fall off. In addition, by making the top surfaces of the bump solder pads higher than the top surface of the die pad, the height of the bonding wires is reduced, thus reducing the overall size of the package. Therefore, the present invention avoids overflow of the encapuslant, secures the bump solder pads in the encapsulant, simplifies the fabrication process and provides more I/O count.

BRIEF DESCRIPTION OF THE DRAWINGS

FIGS. 1A to 1E" are schematic views showing a method for fabricating a QFN semiconductor package according to the present invention, wherein FIG. 1B' is a bottom view of a female mold of FIG. 1B; FIG. 1D' is a schematic view of a semiconductor package with cavities, FIG. 1E' is a schematic view of a semiconductor package with bump solder pads flush with the sides of an encapsulant, and FIG. 1E" is a schematic view of a semiconductor package with a solder mask layer;

FIGS. 3A to 3C are schematic views showing another embodiment of a method for forming die pads, wherein FIG. 3C is a schematic view of a semiconductor package with a die pad.

DETAILED DESCRIPTION OF THE PREFERRED EMBODIMENTS

The following illustrative embodiments are provided to illustrate the disclosure of the present invention, these and other advantages and effects can be apparent to those in the art after reading this specification.

It should be noted that the terms "top surface" and "bottom surface" are used herein for illustrating the connecting relationship between elements and are not intended to limit the present invention.

First Embodiment

FIGS. 1A to 1E" show a method for fabricating a QFN semiconductor package according to the present invention.

Figure 1A:
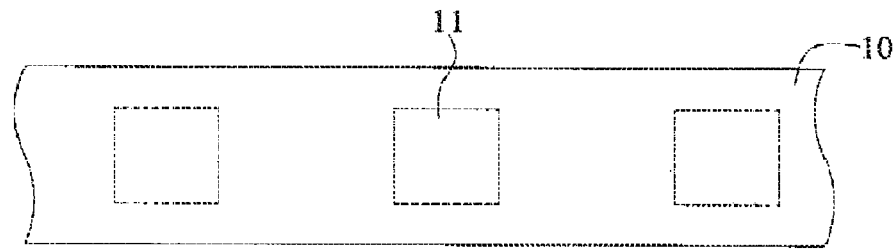

Referring to FIG. 1A, a metal plate 10 made of such as copper is prepared, and a plurality of die mounting areas 11 is defined on the metal plate 10. Further, a metal layer can be formed on the upper and lower surfaces of the metal plate 10 by electroplating. The metal layer can be made of one or more selected from the group consisting of Au, Pd, Ag, Cu and Ni. For example, the metal layer can be made of one of Au/Pd/Ni/Pd, Au/Ni/Cu/Ni/Ag, Au/Ni/Cu/Ag, Pd/Ni/Pd, Au/Ni/Au and Pd/Ni/Au.

Figure 1B:
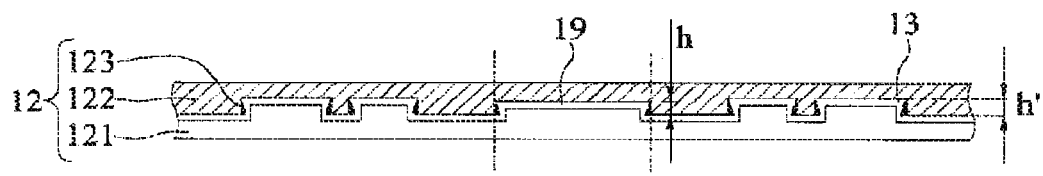
Figure 1B:
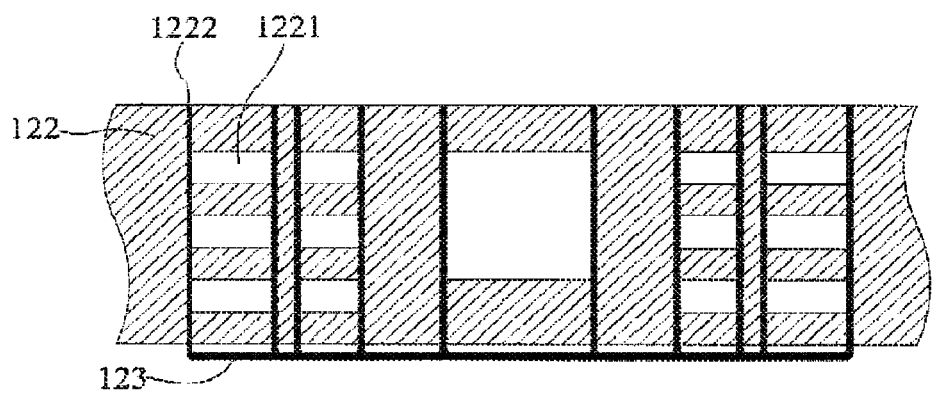

Referring to FIGS. 1B and 1B', the metal plate 10 is pressed by a mold 12 so as to form die pads 19 in the die mounting areas 11 of the metal plate 10, respectively, and form a plurality of bump solder pads 13 around the periphery of each of the die mounting areas 11. Therein, each of the bump solder pads 13 has at least a cross-sectional area greater than another cross-sectional area located underneath along its vertical thickness dimension h' and each of the die pads 19 has at least a cross-sectional area greater than another located underneath along its vertical thickness dimension h, and the bottom surfaces of the bump solder pads 13 are higher than the bottom surfaces of the die pads 19 along its vertical thickness dimension h'. The bump solder pads 13 can have a dovetail shape or a half dovetail shape. As shown in FIG. 1B, the bump solder pads 13 have a dovetail shape, and for any two cross-sectional areas of each of the bump solder pads 13, the cross-sectional area located at the upper position is greater than the other located at the lower position along the vertical thickness dimension h' of the bump solder pad 13. Further, after the metal plate is pressed, a metal layer (not shown) can be formed on the upper and lower surfaces of the metal plate.

In practice, the mold 12 comprises a male mold 121, a female mold 122 and a plurality of insertion elements 123. FIG. 1B' shows a bottom view of the female mold 122. The female mold 122 has a plurality of array-arranged cavities 1221 and grooves 1222 communicating with the cavities 1221 of a same row. The insertion elements 123 can be slidingly disposed in the grooves 1222 such that the open area of the cavities 1221 is less than the bottom area of the cavities 1221. As such, the bump solder pads 13 of a dovetail shape can be formed after the metal plate is pressed.

Figure 1C:
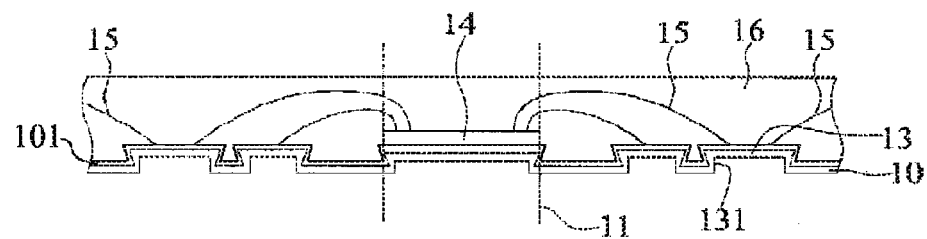

Referring to FIG. 1C, chips 14 are disposed on the die pads 19 and electrically connected to the bump solder pads 13 through bonding wires 15, respectively. Thereafter, an encapsulant 16 is formed to cover the metal plate 10, the chips 14 and the bonding wires 15. Since any cross-sectional area of each of the dovetail-shaped bump solder pads 13 is greater than another located underneath (in the present invention, the cross-sectional area of the cavity 131 of the bump solder pad 13 is included in the cross-sectional area of the bump solder pad 13), i.e., the area of the top surface of each of the bump solder pads 13 is greater than that of the bottom surface, the bump solder pads 13 can be securely embedded in the encapsulant 16. Further, since the bottom surfaces of the bump solder pads 13 are higher than the bottom surfaces of the die pads 19 along its vertical thickness dimension, and the top surfaces of the bump solder pads 13 are higher than the top surfaces of the die pads 19, the height of the bonding wires can be reduced so as to reduce the overall size of the package. Furthermore, the metal plate with a continuous structure is helpful to avoid loose soldering during an ultrasonic soldering process and overflow of the encapsulant.

Referring to FIG. 1D, the bottom of the metal plate 10 is removed by such as cutting or etching such that the die pads 19 and the bump solder pads 13 are arranged at intervals from each other. In FIG. 1D, the bottoms of the die pads 19 and the bump solder pads 13 are flush with the bottom of the encapsulant. In another embodiment, referring to FIG. 1D', cavities 131 are formed corresponding in position to the bottom surfaces of the die pads and the bump solder pads 13, respectively, by setting a pressing depth during the pressing process. Referring to FIG. 1E, solder balls can be disposed in the cavities so as to provide a preferred bonding strength between the solder balls 17 and the bump solder pads. Finally, the encapsulant 16 is cut to form a plurality of semiconductor packages 1. If two adjacent packaging units have common bump solder pads, the cutting process can be performed to cut the encapsulant 16 and between the common bump solder pads 13 such that the bump solder pads 13 located at the outermost portion of the semiconductor packages are exposed from the encapsulant 16 and flush with the sides of the encapsulant 16, as shown in FIG. 1E'. Otherwise, if two adjacent packaging units do not have common bump solder pads 13, the sides of the bump solder pads 13 of the packaging units can be encapsulated by the encapsulant 16.

Further, as shown in FIG. 1E", after the metal plate 10 is removed, a solder mask layer 18 can be formed on the bottom surface of the encapsulant 16, wherein the solder mask layer 18 has a plurality of openings 181 formed for correspondingly exposing the die pads 19 and the bump solder pads 13. Although the bump solder pads 13 with the cavities 131 are illustrated in the present embodiment, it should be understood that the present invention is not limited thereto.

Second Embodiment

Figure 2A:
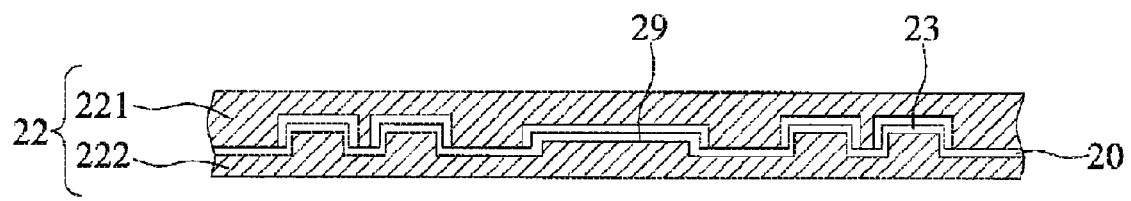
FIGS. 2A to 2C are schematic views showing another embodiment of a method for forming bump solder pads.
Figure 2B:
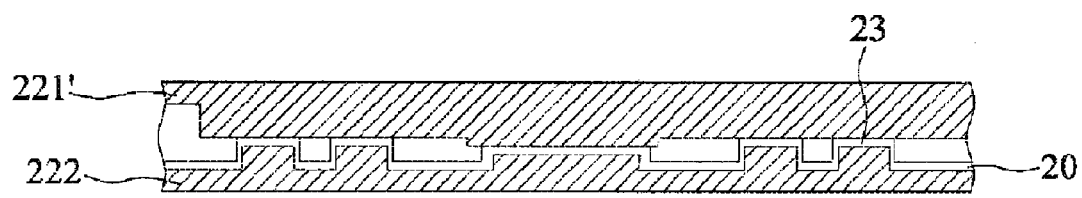
Figure 2C:
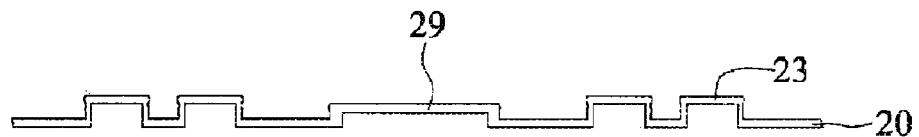

The present embodiment is similar to the first embodiment. The difference between them is the pressing method. As shown in FIGS. 2A to 2C, the step of forming die pads and bump solder pads according to the present embodiment further comprises: pressing a metal plate 20 by a mold 22 having an upper mold 221 and a lower mold 222 so as to form die pads 29 and bump solder pads 23; and pressing again the top surfaces of the die pads 29 and the bump solder pads 23. Thereby, each of the bump solder pads 23 has at least a cross-sectional area greater than another cross-sectional area located underneath along its vertical thickness dimension such that after an encapsulant is formed, the bump solder pads 23 can be securely embedded in the encapsulant. Similarly, each of the die pads 29 has at least a cross-sectional area greater than another cross-sectional area located underneath along its vertical thickness dimension. In particular, as shown in FIG. 2B, the top surfaces of the die pads 29 and the bump solder pads 23 can be pressed by another upper mold 221' such that a metal plate 20 with the bump solder pads 23 can be obtained after the mold is released.

Third Embodiment

Figure 3A:
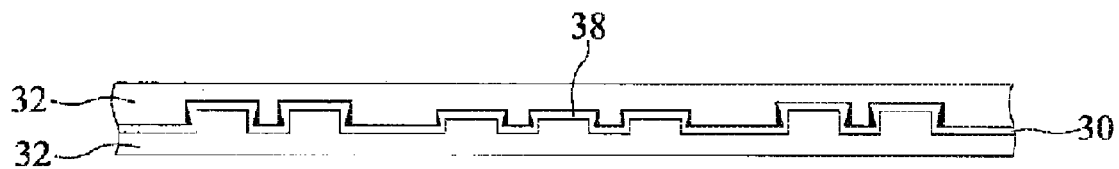
Figure 3B:
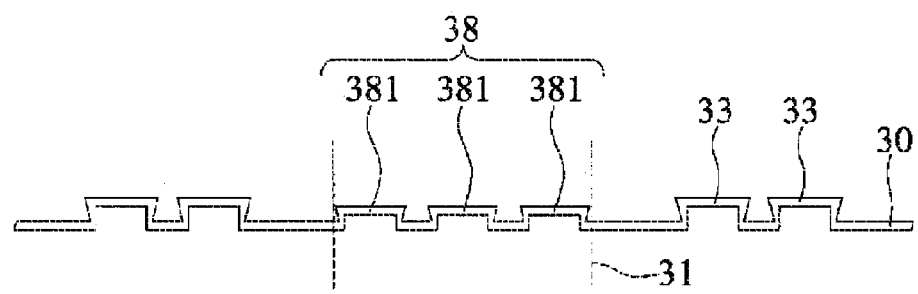

The present embodiment is similar to the above-described embodiments. The difference between them is the shape of die pads. As shown in FIG. 3A, the method of pressing a metal plate 30 further comprises: pressing die mounting areas 31 of the metal plate 30 by a mold 32 to form die pads 38, wherein each of the die pads 38 is composed of a plurality of bump pads 381 having the same shape as bump solder pads 33. Similarly, each of the die pads 38 has at least a cross-sectional area greater than another cross-sectional area located underneath along its vertical thickness dimension.

Figure 3C:
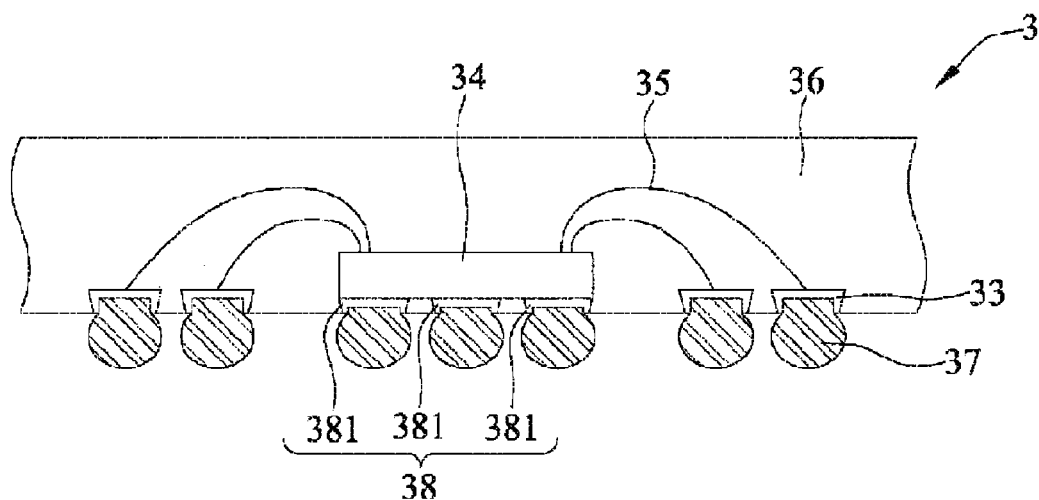
Figure 4A:
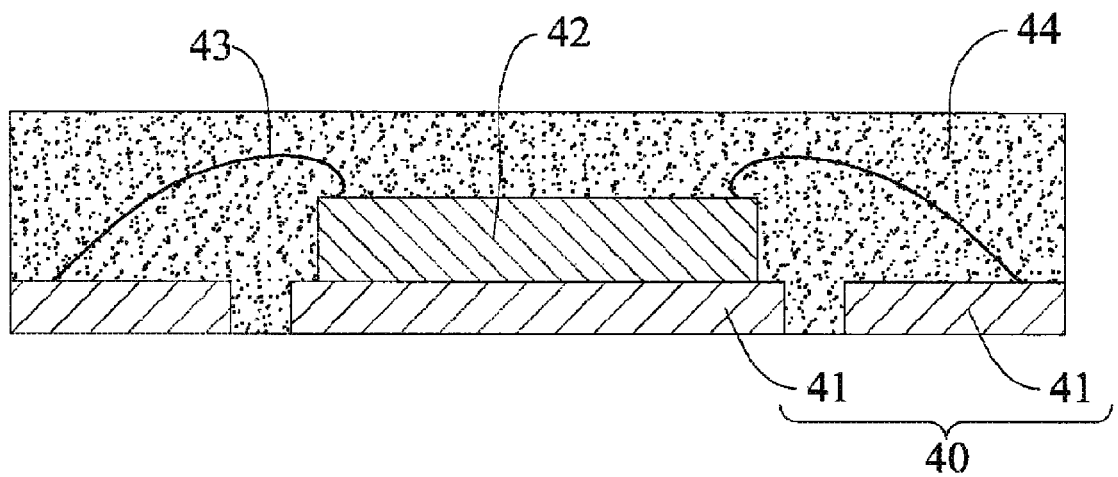
FIGS. 4A and 4B are cross-sectional views of a conventional QFN packaging structure using a lead frame as a chip carrier.
Figure 4B:
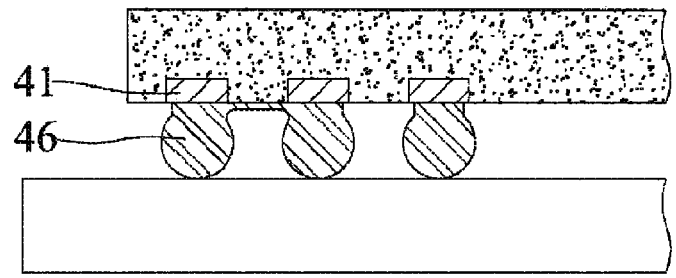

According to the above-described methods, the present invention provides a QFN semiconductor package 1, 3, as shown in FIGS. 1E and 3C. The semiconductor package 1, 3 comprises: a die pad 19, 38 having at least a cross-sectional area greater than another cross-sectional area located underneath along its vertical thickness dimension; a plurality of bump solder pads 13, 33 disposed around the periphery of the die pad 19, 38, wherein each of the bump solder pads 13, 33 has at least a cross-sectional area greater than another cross-sectional area located underneath along its vertical thickness dimension, and the top surfaces of the bump solder pads 13, 33 are higher than the top surface of the die pad 19, 38 along its vertical thickness dimension; a chip 14, 34 disposed on the die pad 19, 38; bonding wires 15, 35 electrically connecting the chip 14, 34 and the bump solder pads 13, 33; and an encapsulant 16, 36 encapsulating the die pad 19, 38, the bump solder pads 13, 33, the chip 14, 44 and the bonding wires 15, 35 such that the die pad 19, 38 and the bump solder pads 13, 33 are securely embedded in the encapsulant 16, 36 while the bottom surfaces of the bump solder pads 13, 33 and the die pads 19, 38 are exposed from the encapsulant 16, 36. In addition, solder balls 17, 37 can be mounted to the bottom surfaces of the bump solder pads 13,33 and the die pad 19, 38.

In the semiconductor package of the present invention, the bump solder pads 13 and the die pads 19 have a dovetail shape as shown in FIG. 1E, a half dovetail shape, or other shape.

As shown in FIG. 1E', the semiconductor package further comprises a solder mask layer 18 disposed on the bottom surface of the encapsulant 16 and having a plurality of openings 181 for correspondingly exposing the die pad 19 and the bump solder pads 13, respectively.

According to the above-described fabrication method, the present invention further provides a metal plate used for fabricating a QFN semiconductor package. As shown in FIG. 1C, the metal plate 10 comprises: a plurality of bump solder pads 13 integrally disposed on the metal plate 10 and surrounding a plurality of die mounting areas 11, wherein each of the bump solder pads 13 has at least a cross-sectional area greater than another cross-sectional area located underneath along its vertical thickness dimension; a plurality of die pads 19 located in the die mounting areas 11, respectively, wherein each of the die pads 19 has at least a cross-sectional area greater than another cross-sectional area located underneath along its vertical thickness dimension; and a plurality of cavities 131 correspondingly formed on the bottom surfaces of the bump solder pads 13.

According to the present invention, the metal plate is removed after formation of the encapsulant, thereby preventing the encapsulant from overflowing onto the bottom surfaces of the bump solder pads as in the prior art. Further, the structure of the bump solder pads allows the bump solder pads to be securely embedded in the encapsulant so as not to fall off In addition, by making the top surfaces of the bump solder pads higher than the top surface of the die pad along its vertical thickness dimension, the height of the bonding wires is reduced, thus reducing the overall size of the package. Therefore, the present invention avoids overflow of the encapuslant, secures the bump solder pads in the encapsulant, simplifies the fabrication process and provides more I/O count.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a QFN semiconductor package, comprising the steps of:
   preparing a metal plate with a plurality of die mounting areas defined thereon;
   pressing the metal plate by a mold so as to form:
      die pads in the die mounting areas of the metal plate, respectively, and
      a plurality of bump solder pads around the periphery of each of the die mounting areas,
      wherein each of the bump solder pads has at least a cross-sectional area greater than another cross-sectional area located underneath along its vertical thickness dimension,
      wherein each of the die pads has at least a cross-sectional area greater than another cross-sectional area located underneath along its vertical thickness dimension, and
      wherein the bottom surfaces of the bump solder pads are higher than the bottom surfaces of the die pads along its vertical thickness dimension;
   mounting chips on the die pads, respectively;
   electrically connecting the chips and the bump solder pads through bonding wires, respectively; and
   forming an encapsulant to cover the metal plate, the chips and the bonding wires such that the bump solder pads are securely embedded in the encapsulant.

2. The method of claim 1, wherein the mold comprises a male mold, a female mold and a plurality of insertion elements, the female mold has a plurality of array-arranged cavities and grooves communicating with the array-arranged cavities of a same row, and the insertion elements are slidingly disposed in the grooves, respectively, such that the open area of the array-arranged cavities is less than the bottom area of the array-arranged cavities.

3. The method of claim 1, wherein the step of pressing the metal plate to form the die pads and the bump solder pads comprises:
pressing the metal plate by the mold to form the die pads and the bump solder pads; and
pressing the top surfaces of the die pads and the bump solder pads such that:
each of the bump solder pads has at least a cross-sectional area greater than another cross-sectional area located underneath along its vertical thickness dimension, and
each of the die pads has at least a cross-sectional area greater than another cross-sectional area located underneath along its vertical thickness dimension.

4. The method of claim 1, wherein the top surfaces of the bump solder pads are higher than the top surfaces of the die pads along its vertical thickness dimension.

5. The method of claim 1, further comprising:
forming a metal layer on the upper and lower surfaces of the metal plate before or after pressing the metal plate.

6. The method of claim 1, wherein the bump solder pads have a dovetail shape or a half dovetail shape.

7. method of claim 1, further comprising:
removing the bottom of the metal plate such that the die pads and the bump solder pads are arranged at intervals from each other; and
cutting the encapsulant.

8. The method of claim 7, further comprising:
after removing the bottom of the metal plate,
forming a solder mask layer on the bottom surface of the encapsulant, and
forming a plurality of openings in the solder mask layer for correspondingly exposing the die pads and the bump solder pads.

9. A method of fabricating a metal plate for fabricating QFN semiconductor package, comprising:
preparing the metal plate with a plurality of die mounting areas defined thereon;
pressing the metal plate by a mold so as to form:
die pads in the die mounting areas of the metal plate, respectively, and
a plurality of bump solder pads around the periphery of each of the die mounting areas,
wherein a plurality of cavities are disposed on the bottom surfaces of the bump solder pads,
wherein each of the bump solder pads has at least a cross-sectional area greater than another cross-sectional area located underneath along its vertical thickness dimension,
wherein each of the die pads has at least a cross-sectional area greater than another cross-sectional area located underneath along its vertical thickness dimension, and
wherein the bottom surfaces of the bump solder pads are higher than the bottom surfaces of the die pads along its vertical thickness dimension.

10. The method of claim 9, wherein the mold comprises a male mold, a female mold and a plurality of insertion elements, the female mold has a plurality of array-arranged cavities and grooves communicating with the array-arranged cavities of a same row, and the insertion elements are slidingly disposed in the grooves, respectively, such that the open area of the array-arranged cavities is less than the bottom area of the array-arranged cavities.

11. The method of claim 9, wherein the step of pressing the metal plate to form the die pads and the bump solder pads comprises:
pressing the metal plate by the mold to form the die pads and the bump solder pads; and
pressing the top surfaces of the die pads and the bump solder pads such that:
each of the bump solder pads has at least a cross-sectional area greater than another cross-sectional area located underneath along its vertical thickness dimension, and
each of the die pads has at least a cross-sectional area greater than another cross-sectional area located underneath along its vertical thickness dimension.

12. The method of claim 9, wherein the top surfaces of the bump solder pads are higher than the top surfaces of the die pads along its vertical thickness dimension.

13. The method of claim 9, further comprising:
forming a metal layer on the upper and lower surfaces of the metal plate before or after pressing the metal plate.

14. The method of claim 9, wherein the bump solder pads have a dovetail shape or a half dovetail shape.

15. The method of claim 9, wherein the metal plate has no through holes.

16. The method of claim 9, wherein the metal plate is a continuous plate.

* * * * *